(12) United States Patent
Nakayama et al.

(10) Patent No.: US 6,395,992 B1
(45) Date of Patent: May 28, 2002

(54) THREE-DIMENSIONAL WIRING BOARD AND ELECTRIC INSULATING MEMBER FOR WIRING BOARD

(75) Inventors: Osamu Nakayama, Yokohama; Toshinori Hosoma, Ube; Takuhiro Ishii, Tokyo, all of (JP)

(73) Assignees: NHK Spring Co., Ltd., Yokohama; Ube Industries, Ltd., Ube, both of (JP)

( * ) Notice: Subject to any disclaimer, the term of this patent is extended or adjusted under 35 U.S.C. 154(b) by 0 days.

(21) Appl. No.: 09/449,654

(22) Filed: Nov. 30, 1999

(30) Foreign Application Priority Data

Dec. 1, 1998 (JP) ............................................ 10-341987

(51) Int. Cl.[7] ................................................ H05K 1/00
(52) U.S. Cl. ........................ 174/254; 174/255; 174/258; 361/792; 361/751; 428/209; 428/458; 428/901
(58) Field of Search ................................ 174/255, 254, 174/256, 257, 258, 259, 268; 366/792, 749, 750, 751, 788, 793; 428/209, 458, 418, 335, 336, 901

(56) References Cited

U.S. PATENT DOCUMENTS

| | | | | |
|---|---|---|---|---|
| 3,330,695 A | * | 7/1967 | Curran | |
| 4,677,252 A | * | 6/1987 | Takahashi et al. | ......... 174/68.5 |
| 5,023,398 A | | 6/1991 | Mahulikar et al. | |
| 5,112,462 A | * | 5/1992 | Swisher | ...................... 205/165 |
| 5,130,192 A | * | 7/1992 | Takabayashi et al. | ....... 428/332 |
| 5,355,283 A | | 10/1994 | Marrs et al. | |
| 5,420,460 A | | 5/1995 | Massingill | |
| 5,434,362 A | * | 7/1995 | Klosowiak et al. | ......... 174/254 |
| 5,525,760 A | * | 6/1996 | Rohatgi et al. | ............. 174/254 |

FOREIGN PATENT DOCUMENTS

| | | | |
|---|---|---|---|
| EP | 0490530 A2 | * | 6/1992 |
| JP | 62-53827 | | 3/1987 |
| JP | 401207987 | * | 8/1989 |

* cited by examiner

Primary Examiner—Kamand Cuneo
Assistant Examiner—I B Patel
(74) Attorney, Agent, or Firm—Frishauf, Holtz, Goodman, Langer & Chick, P.C.

(57) ABSTRACT

A three-dimensional wiring board comprises a metal base having a roughed surface, a heat-bonding type of polyimide film without using adhesive, bonded to the roughed surface and serving as an electric insulating layer, and a copper foil for a conductive layer, bonded to the other surface of the polyimide film. A method for manufacturing the wiring board comprises a roughing treatment process for plating or oxidizing the surface of a metal base, thereby forming a roughed surface, a contact bonding process for attaching a polyimide film to the roughed surface and a copper foil by thermocompression bonding, thereby forming a laminate material, a patterning process for etching the copper foil into a desired conductive pattern, and a bending process for bending the laminate material into a desired three-dimensional shape by press working.

7 Claims, 2 Drawing Sheets

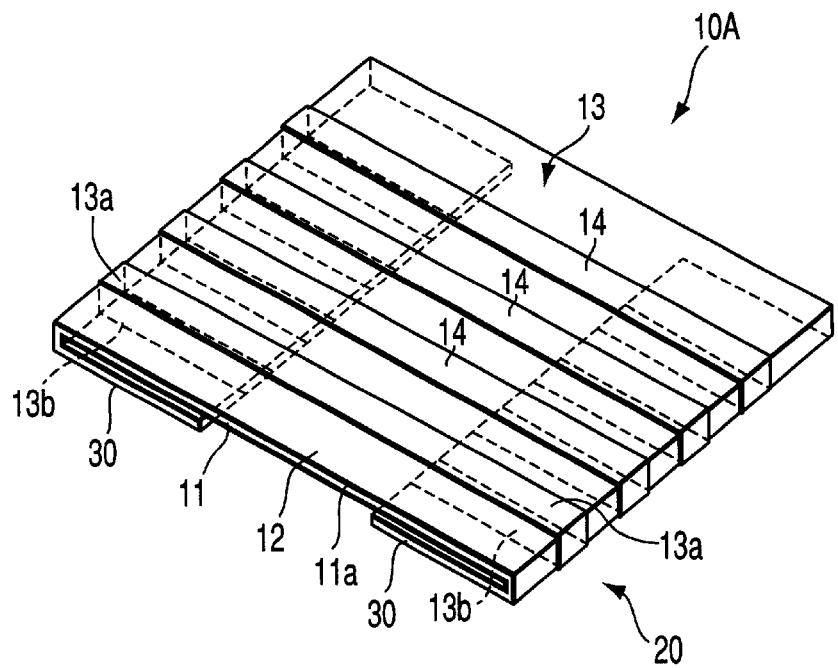
F I G. 4
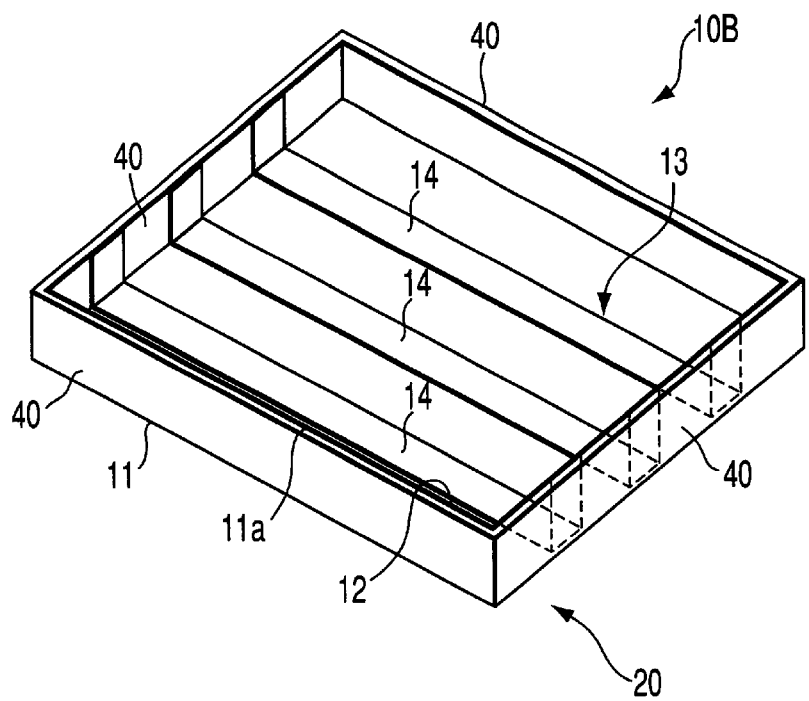
F I G. 5

THREE-DIMENSIONAL WIRING BOARD AND ELECTRIC INSULATING MEMBER FOR WIRING BOARD

BACKGROUND OF THE INVENTION

The present invention relates to a three-dimensional wiring board adapted for use in a wiring part of an electrical component or the like and an electric insulating member for the wiring board.

As a known example of a wiring part of a conventional electrical component, there is a printed wiring board that comprises a base, which is formed of a glass fiber cloth impregnated with epoxy resin or the like, and a conductive pattern formed of a copper foil on the base. Since this conventional wiring board lacks in flexibility, it cannot be easily bent into a three-dimensional shape. To obtain the three-dimensional shape, therefore, this wiring board must inevitably be subjected to machining such as skiving. Thus, the degree of freedom of shape is considerably limited, so that the resulting product lacks in versatility.

Another prior art example is a flexible wiring board in which a copper foil for a conductive pattern is formed on a sheet of a synthetic resin such as polyimide. While this flexible wiring board is highly flexible, it requires additional use of a base member, such as a metal frame, to maintain a desired three-dimensional shape. Accordingly, this conventional flexible wiring board is complicated in construction, entailing use of more components. If it is bent with a small bending radius of about 1 mm in a manner such that it is put on the metal base moreover, the polyimide sheet may peel off in some cases. Thus, the conventional wiring board of this type cannot meet the demand for fine bent shapes, either.

BRIEF SUMMARY OF THE INVENTION

Accordingly, the object of the present invention is to provide a high-versatility three-dimensional wiring board, capable of meeting the requirement for small bending radii and easily ensuring a de sired three-dimensional shape, and an electric insulating member used therein.

In order to achieve the above object, three-dimensional wiring board according to the present invention comprises a metal base having a roughed surface subjected to a roughing treatment a d bent into a desired shape, an electric insulating member formed of a polyimide film bonded to the roughed surface of the metal base and serving as an electric insulating layer, and a metal foil, such as a copper oil, bonded to the other surface of the polyimide film and constituting a conductive layer. The roughed surface is a metallic deposit or oxide layer formed on the surface of the metal base, for example.

According to the invention, there may be obtained a high-versatility three-dimensional wiring board, which can be easily worked into and maintain a desired shape without the possibility of its electric insulating layer or conductive layer cracking or peeling off despite its small bending radius. The three-dimensional wiring board according to the invention, which is provided integrally with the metal base, has good heat dissipation properties, and the metal base can serve as a shield for intercepting external magnetic and electric fields.

A method for manufacturing a three-dimensional wiring board according to the invention comprises a roughing treatment process for subjecting a metal base to a roughing treatment, thereby forming a roughed surface, a contact bonding process for attaching a polyimide film to the roughed surface of the metal base and a metal foil by thermocompression bonding, thereby forming a laminate material including the film, base, and foil stacked in layers, and a bending process for forming the laminate material into a desired three-dimensional shape by press molding or the like.

An electric insulating member for a three-dimensional board according to the invention comprises a polyimide film of the heat-bonding type without using adhesive, sandwiched between a metal base having a roughed surface and a metal foil such as a copper foil, one and the other surface sides of the film being in contact with the roughed surface of the metal base and the metal foil, respectively.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a perspective view of a three-dimensional wiring board according to a second embodiment of the invention; and FIG. 5 is a perspective view of a three-dimensional wiring board according to a third embodiment of the invention.

DETAILED DESCRIPTION OF THE INVENTION

Figure 1:
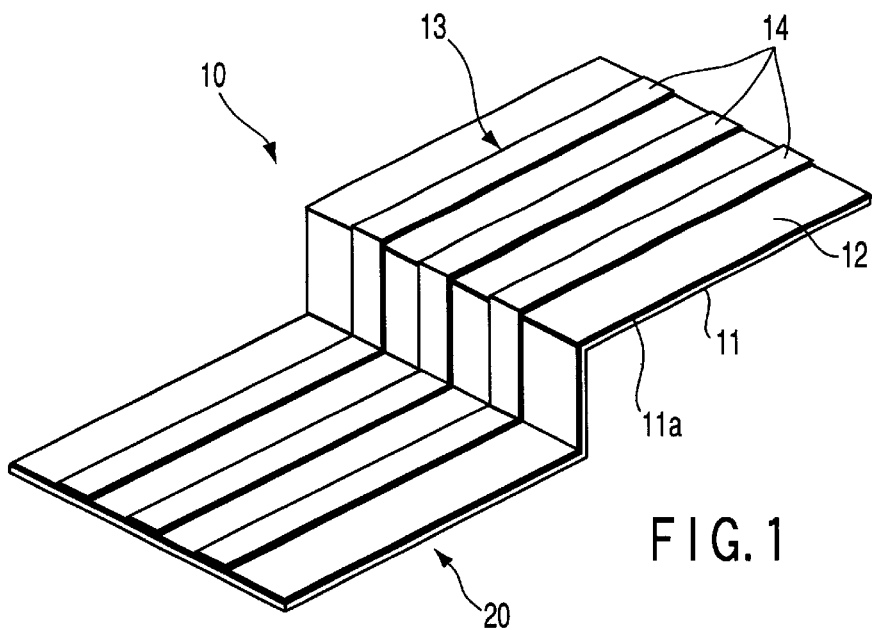
FIG. 1 is a perspective view of a three-dimensional wiring board according to a first embodiment of the present invention.
Figure 2:
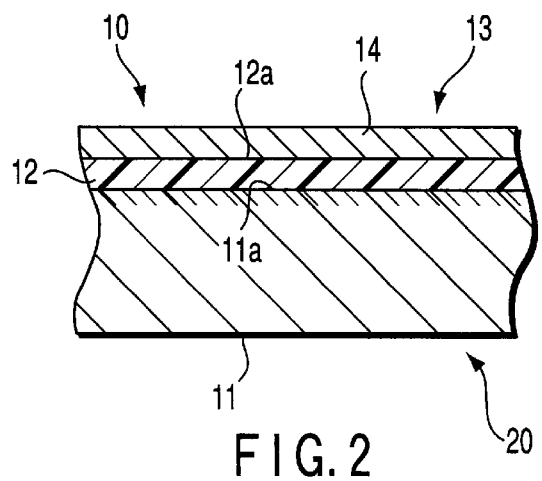
FIG. 2 is an enlarged sectional view showing a part of the wiring board of FIG. 1.
Figure 3:
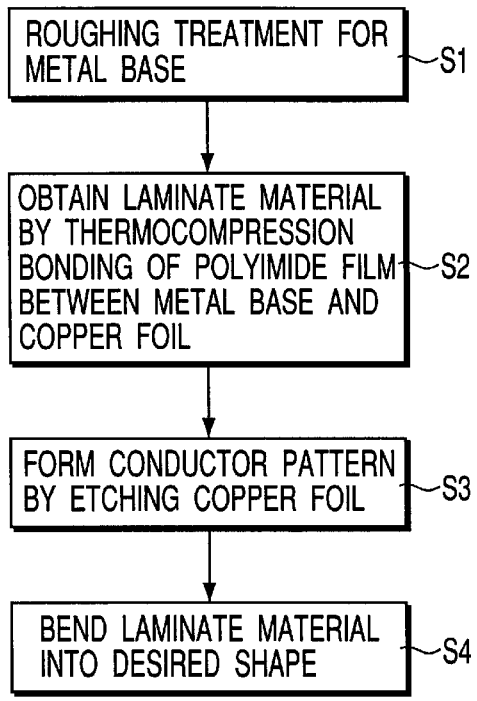
FIG. 3 is a flowchart showing processes for manufacturing the wiring board shown in FIG. 1.

Referring now to FIGS. 1 to 3, there will be described a three-dimensional wiring board according to a first embodiment of the present invention and a manufacturing method therefor.

A three-dimensional wiring board 10 shown in FIG. 1 is provided with a metal base 11 that is bent into a desired shape. The base 11 may be formed of, for example, a ferrous metal or a nonferrous metal, such as copper, aluminum, or alloy based on these metals. The metal base 11 may be 150 μm thick, for example.

As shown in FIG. 2 and other drawings, the metal base 11 has a roughed surface 11a that is subjected to a roughing treatment. The roughing treatment mentioned herein is a treatment for increasing the area of a bonded surface of the metal base 11 to improve the strength of bond with the mating surface. Typical roughing treatments include a treatment for forming fine irregularities on the bonded surface, acid pickling, blasting, blackening, etc. The oxidation treatment, chromate treatment, etc. are typical examples of blackening treatments. In the oxidation treatment, an oxide film is formed on the surface of the metal base 11. A plating treatment with copper or chromium may be used as the roughing treatment.

In the plating treatment, the thickness of a deposit should preferably be made smaller than the normal thickness (1 μm to 5 μm) lest the deposit be cracked when subjected to a bending process (mentioned later). If the deposit thickness is substantially equal to the normal thickness, the deposit may possibly be cracked during the bending process. If the deposit thickness is less than 0.1 μm, however, the anchor effect is so poor that the object of the invention cannot be achieved with ease. Accordingly, the deposit should have a thickness of 0.1 μm or more. Since the deposit is usually softer than the oxide film, a roughed layer prepared by plating need not be so thick as the oxide film, in some cases. In the case where the roughed surface is based on the oxide film, the thickness of the film should be made smaller (less than 0.1 μm to 1 μm) than the normal thickness (about 10 μm) lest the roughed surface 11a be cracked during the bending process.

An electric insulating member 12 (hereinafter referred to simply as polyimide film, in some cases) of a polyimide film of the heat-bonding type without using adhesive, which serves as an electric insulating layer, is attached to the roughed surface 11a of the metal base 11 by thermocompression bonding (that is, heat bonding). The polyimide film 12 is 25 μm thick, for example.

Copper foils 14 for a conductive layer 13 are attached by thermocompression bonding to the other surface of the polyimide film 12, that is, a surface 12a on the side remoter from the metal base 11. Electrolytic copper foils or rolled copper foils are used as the copper foils 14. The foils 14 are 35 μm thick, for example. The metal base 11, polyimide film 12, and copper foils 14 may be attached to one another by using an adhesive instead of carrying out thermocompression bonding.

Processes for manufacturing the three-dimensional wiring board 10 will now be described with reference to FIG. 3.

First, in a roughing treatment process S1, the roughed surface 11a is obtained by plating or oxidizing the surface of the metal base 11.

In a contact bonding process S2, thereafter, the polyimide film 12 for use as an insulating member (electric insulating layer) is sandwiched between the roughed surface 11a of the metal base 11 and the copper foils 14. The film 12 is attached to the base 11 and the copper foils 14 by thermocompression bonding (heat-bonding), whereupon a laminate material 20, composed of these three elements stacked in layers, is obtained. In this thermocompression bonding operation, the base 11, film 12, and copper foils 14 are subjected to a given pressure (e.g., 50 kg/cm$^2$) by pressure members in the thickness direction for a predetermined period of time (e.g., 30 seconds) with the polyimide film 12 heated at a given temperature (e.g., 330° C). Pressurized and heated in this manner, the film 12 is bonded to the mating surfaces (roughed surface 11a and copper foils 14) by means of its own adhesive property.

Then, in a patterning process S3, the copper foils 14 of the laminate material 20 are etched to form the conductive layer 13 with a desired pattern. In a bending process S4, moreover, the laminate material 20 is bent into a desired three-dimensional shape by press working or the like, whereupon the three-dimensional wiring board 10 illustrated in FIG. 1 is obtained.

The peel strength of the polyimide film 12 on the metal base 11 and that of the copper foils 14 on the film 12 should preferably be 1.0 kg/cm or more on the bonding interfaces lest the film 12 peel off during the bending process. The peel strength mentioned herein is a value obtained by measuring a test piece 230 mm long and 3 mm wide at a stress rate of 50 mm/min. and peel angle of 90° in a peeling test based on IPC (International Print Circuit)-TM-650, 2.4.9.

The inventors hereof conducted experiments on the following four comparative examples and the laminate material 20 according to the above-described embodiment, to see if a polyimide film peels off a metal base under varied conditions, 1 mm<R(bending radius)≦5 mm and 0.1 mm≦R≦1 mm. Comparative Example 1 is a laminate material prepared by attaching a polyimide film from Company A to a metal base (not roughed) by thermocompression bonding. Comparative Example 2 is a laminate material prepared by attaching a polyimide film from Company B to a metal base (not roughed) by thermocompression bonding. Comparative Example 3 is a laminate material prepared by attaching a polyimide film from Company C to a metal base (not roughed) by thermocompression bonding. Comparative Example 4 is a laminate material prepared by attaching the polyimide film 12 of the heat-bonding type according to the foregoing embodiment to a metal base (not roughed) by thermocompression bonding. In any of these laminate materials, the metal base and the polyimide film are 150 μm and 25 μm thick, respectively.

Desirable results were obtained by heat-bonding type of polyimide films whose heat-bonding property is effective at a temperature lower than 400° C., with thicknesses of about 10 μm to 50 μm, 25° C. elongation percentages of 30% or more, 50° C.–200° C. coefficients of linear expansion of 25×10$^{-6}$ cm/cm/° C. or less, and tensile elastic moduli (MD, ASTM-D882) of 400 kg/mm$^2$ or more.

TABLE 1 shows the results of the peeling test. When Comparative Examples 1 to 3 were bent with the bending radius R larger than 1 mm, all their polyimide films peeled off. In contrast with this, neither of the polyimide films according to Comparative Example 4 and the embodiment cracked or peeled off. When Comparative Examples 1 to 4 were bent with the bending radius R of 1 mm or less, on the other hand, all their polyimide films peeled off. However, the polyimide film 12 according to the embodiment was found to stand bending with a small bending radius of 1 mm or less without cracking or peeling off. Thus, it was confirmed that combination of roughing of the metal base 11 and the heat-bonding type of polyimide film 12 described in connected with the foregoing embodiment is very effective.

A polyimide film (trademark: UPILEX-VT) from UBE Industries, Ltd. shown in TABLE 1 has a thickness of 25 μm, 25° C. elongation percentage of 54%, 50° C.–200° C. coefficient of linear expansion of 18×10$^{-6}$ cm/cm/° C., and tensile elastic modulus (MD, ASTM-D882) of 700 kg/mm$^2$ or more.

TABLE 1

| | POLYIMIDE FILM | Metal Base Roughing Treatment | Bending Radius (R)mm | |
|---|---|---|---|---|
| | | | 1 < R ≦ 5 | 0.1 ≦ R ≦ 1 |
| Comparative Example 1 | Polyimide from Company A | Not Roughed | Peeled | Peeled |
| Comparative Example 2 | Polyimide from Company B | Not Roughed | Peeled | Peeled |
| Comparative Example 3 | Polyimide from Company C | Not Roughed | Peeled | Peeled |
| Comparative | Polyimide from | Not Roughed | Not | Peeled |

TABLE 1-continued

|  | POLYIMIDE FILM | Metal Base Roughing Treatment | Bending Radius (R)mm | |
|---|---|---|---|---|
|  |  |  | 1 < R ≦ 5 | 0.1 ≦ R ≦ 1 |
| Example 4 | UBE industries, Ltd.* |  | Peeled |  |
| Embodiment | Polyimide from UBE industries, Ltd.* | Roughed | Not Peeled | Not Peeled |

(*UPILEX-VT)

According to the embodiment described above, only the metal base 11 is roughed, and the copper foils 14 are not. In the cage where each copper foil 14 is thinner enough than the metal base 11, it bends so easily that it cannot easily peels off the polyimide film 12 despite its small bending radius. Therefore, it is necessary only that the metal base 11 be roughed. If necessary, however, the bonded surface of each copper foil 14 on the polyimide film 12 may be also roughed.

FIG. 4 shows a three-dimensional wiring board 10A that has turned edges 30. Each turned edge 30 is formed by turning down a part of the laminate material 20 so that the copper foils 14 are outside. Unlike conventional wiring boards, therefore, the wiring board 10A can be designed so that conductive layers 13a and 13b on the opposite surfaces thereof, obverse and reverse, are connected electrically to each other without being formed having through holes and a conductive layer inside the holes. For the constructions, functions, and effects of other components and the manufacturing method, this second embodiment resembles the first embodiment. A metal base 11 can serve satisfactorily to maintain the bent shape of each turned edge 30 according to the second embodiment.

FIG. 5 shows a box-shaped three-dimensional wiring board 10B that is formed by press working so as to have upright walls 40. For the constructions, functions, and effects of other components and the manufacturing method, this third embodiment resembles the first embodiment. A metal base 11 can serve satisfactorily to maintain the shape of a bent box according to the third embodiment.

It is to be understood that the elements that constitute the present invention, such as the metal base, polyimide film, metal foils, etc., or the bent shape of the wiring board may be suitably modified in carrying out the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A three-dimensional wiring board comprising:
   a metal base having a roughened surface and being bent into a desired shape;
   an electric insulating member formed of a heat-bonding type of polyimide film bonded to the roughened surface of the metal base without using adhesive, said polyimide film having an base without using adhesive, said polyimide film having an elongation percentage of 30% or more, a 50° C.–200° C. coefficient of linear expansion of $25 \times 10^{-6}$ cm/cm/° C. or less, a tensile elastic modulus of 400 kg/mm$^2$ or more and maintaining its bond to the roughened surface of the metal base even if the metal base is bent with a bending radius of 0.1 mm to 1 mm or less; and
   a metal foil bonded to the outer surface of the polyimide film, said metal foil constituting a conductive layer.

2. The three-dimensional wiring board according to claim 1, wherein said polyimide film has a thickness of about 10 μm to 50 μm.

3. The three-dimensional wiring board according to claim 1, wherein said metal foil comprises copper.

4. The three-dimensional wiring board according to claim 1, wherein said roughened surface is formed by at least one of blackening, forming fine irregularities on the bonded surface, acid picketing, blasting or plating.

5. The three-dimensional wiring board according to claim 1 wherein the roughened surface of the metal base is formed by a roughening treatment.

6. An electric insulating member for a three-dimensional board, comprising a polyimide film of the heat-bonding type without using adhesive, sandwiched between a metal base, having a roughed surface and adapted to be bent into a desired shape, and a metal foil constituting a conductive layer, one and an other surface of the film being in contact with the, roughened surface of the metal base and the metal foil, respectively, said polyimide film having an elongation percentage of 30% or more, a 50° C.–200° C. coefficient of linear expansion of $25 \times 10^{-6}$ cm/cm° C. or less, a tensile elastic modulus of 400 kg/mm$^2$ or more and maintaining contact with the roughed surface of the metal base even if the metal base is bent with a bending radius of 0.1 mm to 1 mm.

7. The electric insulating member according to claim 6, wherein said polyimide film has a thickness of about 10 μm to 50 μm.

* * * * *